(12) United States Patent
Sicard

(10) Patent No.: US 9,407,192 B2
(45) Date of Patent: Aug. 2, 2016

(54) METHOD AND APPARATUS FOR CHARGING A BOOTSTRAP CHARGE STORAGE DEVICE

(75) Inventor: Thierry Sicard, Auzeville Tolosane (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/400,086

(22) PCT Filed: Jun. 5, 2012

(86) PCT No.: PCT/IB2012/001270
§ 371 (c)(1),
(2), (4) Date: Nov. 10, 2014

(87) PCT Pub. No.: WO2013/182867
PCT Pub. Date: Dec. 12, 2013

(65) Prior Publication Data
US 2015/0108936 A1 Apr. 23, 2015

(51) Int. Cl.
*H02P 29/00* (2006.01)
*H02P 7/06* (2006.01)
*H03K 17/06* (2006.01)

(52) U.S. Cl.
CPC .............. *H02P 29/00* (2013.01); *H03K 17/063* (2013.01); *H03K 2217/0036* (2013.01); *H03K 2217/0063* (2013.01); *H03K 2217/0081* (2013.01)

(58) Field of Classification Search
CPC ........... H02P 29/00; H02P 7/06; H02P 7/285; H02P 27/06; H02P 6/205
USPC .......... 318/244, 245; 388/809, 816, 819, 821, 388/822
See application file for complete search history.

(56) References Cited

U.S. PATENT DOCUMENTS

| 4,088,937 A | * | 5/1978 | Uchida | H02M 7/162 318/441 |
| 4,553,082 A | * | 11/1985 | Nesler | H02M 3/155 323/282 |

(Continued)

FOREIGN PATENT DOCUMENTS

| JP | 2002037099 A | 2/2002 |
| JP | 2007006658 A | 1/2007 |

(Continued)

OTHER PUBLICATIONS

International Search Report and Written Opinion correlating to PCT/IB2012/001270 dated Apr. 5, 2013.

*Primary Examiner* — Bentsu Ro

(57) ABSTRACT

A charging circuit for at least one bootstrap charge storage element within an inertial load driver circuit is described, the at least one bootstrap charge storage element comprising a first node operably coupled to an output node of at least one switching element of the inertial load driver circuit. The charging circuit comprises at least one current source controllable to provide a current to a second node of the at least one bootstrap charge storage element, and at least one detection component arranged to receive at a first input thereof an indication of a voltage level at the output node of the at least one switching element of the inertial load driver circuit, detect when the voltage level at the output node of the switching element of the inertial load driver circuit is below a negative threshold voltage level, and control the at least one current source to provide a current to the second node of the at least one bootstrap charge storage element when the voltage level at the output node of the switching element of the inertial load driver circuit is below the negative threshold voltage level.

13 Claims, 2 Drawing Sheets

(56) References Cited

U.S. PATENT DOCUMENTS

| | | |
|---|---|---|
| 5,508,874 A | 4/1996 | Williams et al. |
| 5,914,589 A | 6/1999 | Erckert |
| 5,939,834 A | 8/1999 | Nerone |
| 6,285,146 B1 * | 9/2001 | Harlan ............ H02P 6/10 318/400.04 |
| 6,429,624 B2 * | 8/2002 | Fujisawa ........... H02J 7/027 320/134 |
| 6,963,498 B2 * | 11/2005 | Nadd ............... H02M 1/08 327/108 |
| 7,477,034 B2 | 1/2009 | MacKay |
| 7,592,761 B2 | 9/2009 | MacKay |
| 8,022,746 B1 * | 9/2011 | Signoretti ........ H03K 17/6871 327/390 |
| 2009/0027096 A1 | 1/2009 | Mourrier et al. |

FOREIGN PATENT DOCUMENTS

| | | |
|---|---|---|
| JP | 2008141832 A | 6/2008 |
| JP | 2012075048 A | 4/2012 |
| WO | 2006/030569 A1 | 3/2006 |

* cited by examiner

METHOD AND APPARATUS FOR CHARGING A BOOTSTRAP CHARGE STORAGE DEVICE

FIELD OF THE INVENTION

The field of this invention relates to a method and apparatus for charging a bootstrap charge storage device, and in particular to a charging circuit for at least one bootstrap charge storage element within an inertial load driver circuit and method therefor.

BACKGROUND OF THE INVENTION

In the field of integrated circuit (IC) devices, using only N-channel MOSFET (metal oxide semiconductor field effect transistor) devices, also known as NMOS devices, is a common cost reduction method due largely to die size reduction, as well as due to other benefits. However, using NMOS devices in place of PMOS (P-channel MOSFET) devices typically involves the NMOS device being positioned on a 'high side' of a load, where the NMOS device is located between the load and the supply voltage rail. When the NMOS device is in a fully 'open' state (i.e. in saturation mode in which current is able to flow freely through the NMOS device), the source node is effectively coupled to the supply voltage rail via the open NMOS device. In order to achieve a fully open state, a significant positive voltage ($V_{GS}$) across the gate and source nodes is required in order to bias the NMOS device into saturation mode. To achieve this, the gate voltage must be greater than the drain voltage (i.e. the supply rail voltage) by at least the threshold voltage level ($V_{th}$). Clearly, where the supply rail voltage is the highest available supplied voltage signal, some means of generating a higher voltage level is required.

To this end, it is known to use a bootstrap charge storage device, such as a bootstrap capacitor, to generate the higher voltage level. FIG. 1 illustrates a simplified circuit diagram of an example of a DC (direct current) motor driver circuit 100 comprising a high-side NMOS device 110 and a bootstrap capacitor 120. The gate node voltage of the NMOS device 110 is generated by a control signal 130 passed through gate control circuitry, which in the simplified example of FIG. 1 is illustrated as comprising buffer logic 140. A negative supply rail for this buffer logic 140 is operably coupled to the source node 112 of the NMOS device 110, and a positive supply rail 144 for this buffer logic 140 is operably coupled to the negative supply rail 142 via the bootstrap capacitor 120. In this manner, 'floating' supply voltage rails are provided to the buffer logic 140, with the negative rail voltage being tied to the source voltage of the NMOS device 110, and the positive rail voltage being determined by the voltage across the bootstrap capacitor 120. Accordingly, by maintaining a suitable charge within the bootstrap capacitor 120, it is possible to generate a gate voltage sufficiently high to force the NMOS device 120 into its saturation mode.

In a typical intermittent driver mode (e.g. 100 ms on, 100 ms off), the bootstrap capacitor 120 discharges during the off state of the driver circuit 100. Accordingly, it is necessary to compensate for such discharging of the bootstrap capacitor 120 in order to maintain a large enough charge therein to generate a gate voltage sufficiently high to force the NMOS device 120 into its saturation mode. In such a conventional driver circuit 100 comprising such a bootstrap capacitor 120, a charge pump 150 is typically provided and arranged to inject some current into the bootstrap capacitor 120 during the off state of the driver circuit 100. In this manner, a suitable charge within the bootstrap capacitor 120 may be maintained.

Recently, requirements for such driver circuits have stipulated that no power consumption may occur during the off state of the driver circuit 100. As such, the use of such a charge pump 150 during an off state of the driver circuit 100 is not permitted under such customer requirements. Accordingly, the use of such a charge pump 150 would be limited to during the on state of the driver circuit 100. However, because of the inherent charge loss within the bootstrap capacitor during the off state of the driver circuit 100, there will be an initial period during the on state of the driver circuit 100 in which the bootstrap capacitor 120 is required to be recharged. During such an initial period, an insufficiently high bias voltage will be available to fully turn on the NMOS device 110, resulting in increased current limitation within the NMOS device 110 during that initial period, and thus increased heat generation within the NMOS device 110, which is undesirable and in some cases may be unacceptable.

SUMMARY OF THE INVENTION

The present invention provides a charging circuit for at least one bootstrap charge storage element within an inertial load driver circuit, an inertial load driver circuit comprising such a charging circuit and a method of charging at least one bootstrap charge storage element within an inertial load driver circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
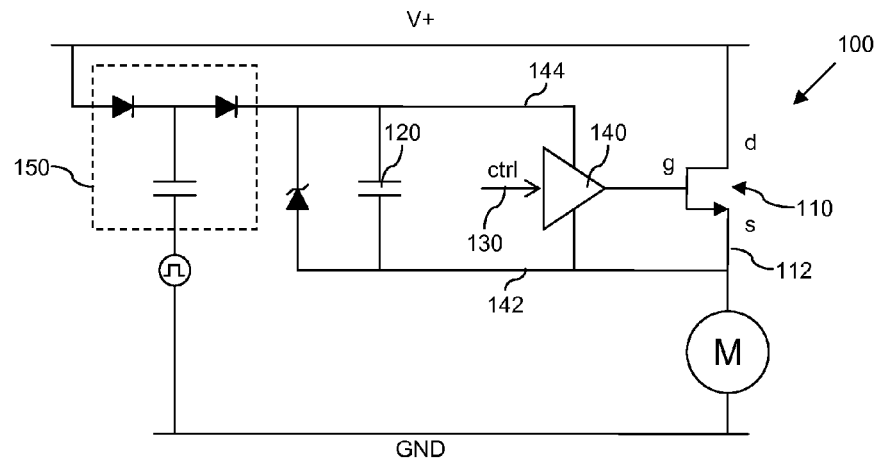
FIG. 1 illustrates a simplified circuit diagram of an example of a known DC (direct current) motor driver circuit.

The present invention will now be described with reference to a charging circuit for a bootstrap charge storage element, such as a bootstrap capacitor, within a direct current (DC) motor driver circuit, and a method therefor. However, it will be appreciated that the present invention is not limited to the specific embodiment illustrated in the drawings and described herein, and in particular is not limited to a method and apparatus for charging a bootstrap charge storage device within a driver circuit for a DC motor, and may equally be implemented within a method and apparatus for charging a bootstrap charge storage device within any form of inertial load driver circuit. For example, it is contemplated that the present invention may alternatively be implemented within a charging circuit for charging a bootstrap charge storage device within a driver circuit for, say, an inductive load. For clarity, the term inertial load used herein may refer to any load that comprises a resistance to a change of current flow there through. Typically such loads are capable of storing energy therein which enables the resistance to such changes in current flow. For example, in the case of a DC motor, energy is stored as rotational kinetic energy within a rotating armature of the DC motor. Similarly, in the case of an inductive load, energy is stored within a magnetic field generated by the inductive load.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 2:
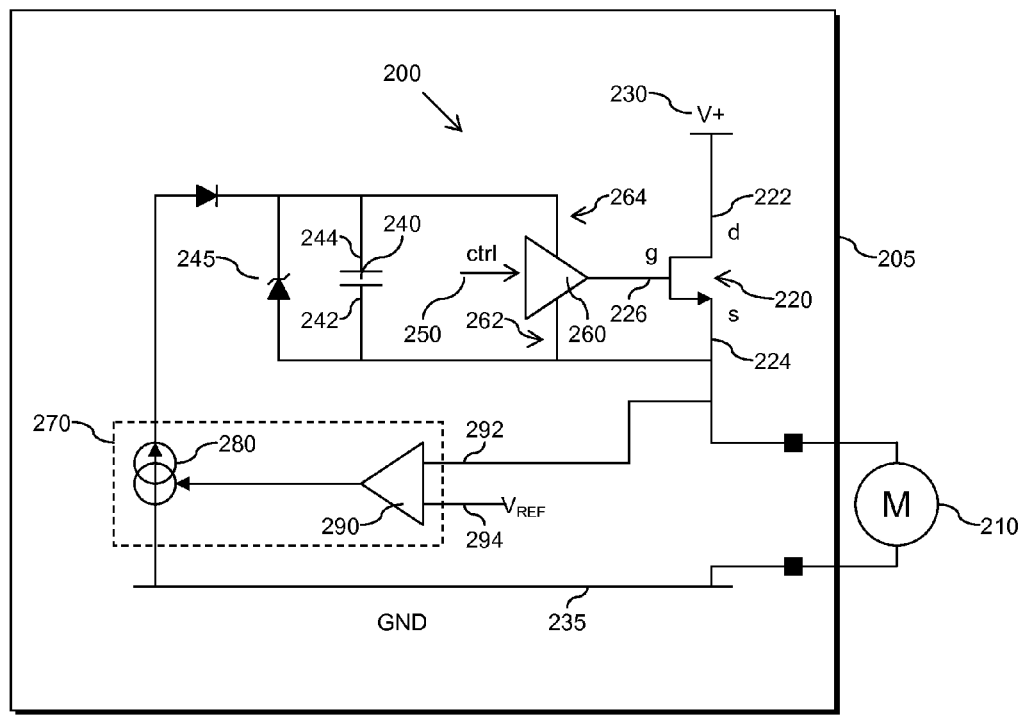
FIG. 2 illustrates a simplified circuit diagram of an example of a driver circuit for an inertial load.

Referring now to FIG. 2, there is illustrated a simplified circuit diagram of an example of a driver circuit 200 for an inertial load, which in the illustrated example comprises a DC motor 210, and the driver circuit 200 is implemented within an integrated circuit device 205. The driver circuit 200 comprises a switching element, for example a power switch such as a power transistor, for example a field-effect transistor or a bipolar transitor. Suitable examples are for instance power (Metal-Oxide) Field Effect Transistors ((MOS-)FETs), Insulated Gate Bipolar transistors (IGBTs), bipolar junction transistors (BJTs), heterojunction bipolar transistors (HBPs), heterostructure FETS (HFETs) or any other type of power transistor. The power transistor may for example be able to control a current of 50 A or more, for example 100 A or more. In an example, use of the driver circuit with a power transistor with an internal resistance of 2 milli Ohm and able to control a maximum current of 120 A has been experimented for instance.

In the illustrated example the switch comprises an n-channel metal oxide semiconductor (NMOS) device 220, such as an NMOS field effect transistor. A drain node 222 of the NMOS device 220 is operably coupled to the positive supply voltage 230. In some examples, the driver circuit 200 may be implemented within an automotive application, wherein the positive supply voltage 230 is provided by, for example, a 12V vehicle battery. A source node 224 of the NMOS device 220 is operably coupled to the DC motor 210, and thus comprises an output of the NMOS device 220. In this manner, the NMOS device 220 is operably coupled between the DC motor 210 and a positive supply voltage 230, and as such comprises a high-side NMOS device, and is arranged to selectively couple the DC motor 210 to the positive supply voltage 230 in accordance with a bias voltage received at a gate node 226 thereof.

In order to achieve a fully open state of the NMOS device 220, a significant positive voltage ($V_{GS}$) across the gate and source nodes 226, 224 is required in order to bias the NMOS device 220 into a saturation mode. Notably, in this high-side configuration, if the NMOS device 220 is in a fully open state (i.e. in a saturation mode in which current is able to flow freely through the NMOS device 220), the source node 224 is effectively coupled directly to the drain node 222, and thus to the positive supply voltage 230 via the open NMOS device 220. Accordingly, in order to achieve a fully open state, the voltage at the gate node 226 must be greater than the voltage at the drain node 222 (i.e. the positive supply voltage 230) by at least the threshold voltage level ($V_{th}$) required across the gate and source nodes 226, 224 to bias the NMOS device 220 into the saturation mode. Since the supply voltage 230 is typically the highest available supplied voltage signal, some means of generating a higher voltage level is required. To this end, the driver circuit 200 of FIG. 2 comprises a bootstrap charge storage device, illustrated generally by way of bootstrap capacitance 240.

The driver circuit 200 further comprises a switching element control component comprising circuitry arranged to output a control signal to the at NMOS device 220. In the illustrated example, the switching element control component comprises circuitry in the form of a buffer logic gate 260. The buffer logic gate 260 is arranged to receive a control signal 250, and to output a corresponding control signal in the form of a bias voltage signal to the gate node 226 of the NMOS device 220 in accordance with the received control signal 250. A negative supply voltage input 262 of the buffer logic gate 260 is operably coupled to the output of the NMOS device 220, i.e. to the source node 224 in the illustrated example. A positive supply voltage input 264 of the buffer logic gate 260 is operably coupled to the negative supply voltage input 262 of the buffer logic gate 260 via the bootstrap capacitance 240. In particular, in the illustrated example a first node 242 of the bootstrap capacitance 240 is operably coupled to the negative supply voltage input 262 of the buffer logic gate 260 and the source node 224 of the NMOS device 220, and a second node 244 of the bootstrap capacitance 240 is operably coupled to the positive supply voltage input 264 of the buffer logic gate 260. In this manner, 'floating' supply voltages are provided to the buffer logic gate 260, with the negative supply voltage being tied to the voltage at the source node 224 (i.e. output) of the NMOS device 220, and the positive supply voltage being determined by the voltage across the bootstrap capacitance 240. Accordingly, by maintaining a suitable charge within the bootstrap capacitance 240, it is possible for the buffer logic gate 260 to generate a bias voltage signal at the gate node 226 of the NMOS device 220 sufficiently high to force the NMOS device 220 into its saturation mode.

In a typical intermittent driver mode (e.g. 100 ms on, 100 ms off), the bootstrap capacitance 240 discharges during the off state of the driver circuit 200. Accordingly, it is necessary to compensate for such discharging of the bootstrap capacitance 240 in order to maintain a large enough charge therein to generate a gate voltage sufficiently high to force the NMOS device 220 into its saturation mode. Recent customer requirements stipulate that no power consumption may occur during the off state of the driver circuit 200. Accordingly, it is not permitted to draw charge from the positive voltage supply 230 during the off state of the driver circuit 200 to maintain the charge within the bootstrap capacitance 240. However, allowing the bootstrap capacitance 240 to discharge during the off state of the driver circuit 200 means that there will be an initial period during each on state of the driver circuit 200 in which the bootstrap capacitance 240 is required to be recharged. During such an initial period, an insufficiently high bias voltage will be available to fully turn on the NMOS device 220, resulting in increased current limitation within the NMOS device 220 during that initial period, and thus increased heat generation within the NMOS device 220, which is undesirable and in some cases may be unacceptable.

In an inertial load, such as in the case of the DC motor 210 illustrated in FIG. 2, if the NMOS device 220 is open, the DC motor 210 is supplied by the positive voltage supply 230, and the DC motor 210 runs. If the NMOS device 220 is subsequently 'closed', the current flow through the NMOS device 220, and thus provided to the DC motor 210, drops to zero. However, the inertia of the DC motor 210 means that the DC motor 210 will continue to rotate following the NMOS device 220 being subsequently closed. This continued rotation of the DC motor 210 transforms the DC motor 210 into a voltage generator, resulting in a back electromotive force (BEMF) being created across the DC motor 210. The voltage generated is proportional to the speed of the DC motor 210, and thus will gradual decrease as the rotation of the DC motor 210 slows.

In the illustrated example of FIG. 2, the DC motor 210 is coupled between the source node 224 of the NMOS device 220 and a ground plane 235. Accordingly, the generation of a voltage across the DC motor 210 as a result of the BEMF causes the voltage at the source node 224 of the NMOS device 220 to be pulled down relative to the ground plane 235. Thus, during the off state of the driver circuit 200, the source node 224 of the NMOS device 220 comprises a negative voltage with respect to the ground plane 235. In some examples, for example in which the driver circuit 200 is implemented within an automotive application in which the positive supply voltage 230 comprises 12V supplied from, say, a vehicle battery, the average voltage generated by the DC motor 210 during the off state of the driver circuit 200 is typically around 5V in magnitude to begin with, and dropping off as the rotation of the DC motor 210 slows. However, the inventor has observed that, whilst the average voltage created by the BEMF comprises a relatively low average magnitude DC voltage (e.g. less than 5V in magnitude), when looked at more closely, this low average magnitude DC voltage comprises voltage spikes (caused by the brushes changing from one contact to another within the DC motor 210) that individually comprise a relatively high magnitude DC voltage. In particular, the inventor has observed that, each time the electrical circuit within the DC motor 210 changes from one contact to another contact, the BEMF generates a voltage spike, with the peak voltage for these spikes being bellow −5V (i.e. having a magnitude greater than 5V); even down to −12V.

In the illustrated example, the voltage across the bootstrap capacitance 240 is clamped by a Zener diode 245. In the example in which the driver circuit 200 is implemented within an automotive application in which the positive supply voltage 230 comprises 12V supplied from a vehicle battery, the voltage across the bootstrap capacitance 240 may be clamped at, say, 10 volts. Accordingly, in order to be able to fully (re)charge the bootstrap capacitance 240, a voltage of at least 10V must be applied across the bootstrap capacitance 240. The inventor has recognised that, whilst the relatively low average magnitude DC voltage generated by the BEMF of the DC motor 210 is too low to be able to fully (re)charge the bootstrap capacitance 240, the individual voltage spikes within the BEMF generated voltage at the source node 224 of the NMOS device 220 are of sufficient magnitude to be capable of fully (re)charging the bootstrap capacitance 240.

The driver circuit 200 in the illustrated example further comprises a charging circuit 270. The charging circuit comprises a current source 280 controllable to provide a current to the second node 244 of the bootstrap capacitance 240, and a detection component 290. The detection component 290 is arranged to receive at a first input 292 thereof an indication of a voltage level at the output (source) node 224 of the NMOS device 220, detect if the voltage level at the output node 224 of the NMOS device 220 is below a negative threshold voltage level, and control the current source 280 to provide a current to the second node 244 of the bootstrap capacitance 240 if the voltage level at the output node 224 of the NMOS device 220 is below the negative threshold voltage level.

In the illustrated example, the detection component 290 comprises a comparator component arranged to receive at a second input 294 thereof an indication of the negative threshold voltage level ($V_{REF}$), compare the received indication of a voltage level at the output node 224 of the NMOS device 220 to the received indication of the negative voltage level, and to output to the current source 280 a result of the comparison. The current source 280, which in some examples may comprise a switching element, for example such as an NMOS device, operably coupled between the second node 242 of the bootstrap capacitance 240 and the ground plane 235, may thus selectively couple the second node 242 of the bootstrap capacitance 240 to the ground plane 235 in accordance with the result of the caparison performed by the detection component 290. In this example, the current source is represented as an ideal current source, whereas in other examples the current source may be configured to only come from the positive supply voltage 230 (e.g. V+ battery). In such an example, the connection to the ground plane 235, may be replaced by a connection to the positive supply voltage 230.

In this manner, if the voltage level at the output node 224 of the NMOS device 220 drops below the negative threshold voltage level, the detection component 290 enables current to be provided to the bootstrap capacitance 240 by the current source 280. Because the first node 242 of the bootstrap capacitance 240 is operably coupled to the output node 224 of the NMOS device 220, which comprises a voltage level below the negative threshold voltage level, this negative voltage level 'pulls' charge from the current source 280 into the bootstrap capacitance, (re)charging the bootstrap capacitance 240. Thus, in the illustrated example, during the off state of the driver circuit 200, the negative voltage generated at the source node 224 of the NMOS device 220 by the BEMF of the DC motor 210 may be used (re)charge the bootstrap capacitance 240. In particular, in the illustrated example, by configuring an appropriate negative threshold voltage level, the current source 280 may be arranged to only provide a current to the second node 244 of the bootstrap capacitance 240 during the voltage spikes (caused by the changing from one contact to another within the DC motor 210) that individually comprise sufficiently high magnitude DC voltage levels capable of fully (re)charging the bootstrap capacitance 240 to, in the illustrated example, a required voltage level of 10V. In this manner, it has been found that the BEMF voltage spikes are capable of providing sufficient charge to the bootstrap capacitance 240 to prevent the bootstrap capacitance 240 from discharging during the off state of the driver circuit 200, and without the need to draw current from the voltage supply 230. As a result, there is no initial period during the subsequent on state of the driver circuit 200 in which it is necessary for the bootstrap capacitance to be recharged in order to fully turn on the NMOS device 220.

It is known to use flyback diodes, also known as freewheeling diodes, snubber diodes, etc., to provide a current path across the inertial load to allow the inertial load to draw current from itself if its supply voltage is removed or reduced, for example during a off state of the driver circuit 200 in the illustrated example. In this manner, the energy within the inertial load may be safely dissipated. However, in automotive applications, it is a requirement that devices are capable of sustaining a reverse battery condition, wherein if the vehicle battery is connected in reverse for a period of, say, 1 or 2 minutes, no electrical or electronic device or module should be destroyed. In the case of the high side NMOS device 220 in the illustrated example, the NMOS device 220 comprises an intrinsic diode between the drain node 222 and the source node 224 thereof. As such, in a reverse battery condition, current is able to flow from the 'ground' connection (which in a reverse battery condition would comprise a positive voltage level), through the DC motor 210, through the intrinsic diode of the NMOS device 220 from the source node 224 to the drain node 222, and thus to the positive voltage supply rail 230 (which in a reverse battery condition would comprise a negative voltage level). The current flow through the NMOS device 220 would be limited by the resistance of the DC motor 210, which would simply run in 'reverse', thereby protecting the NMOS device 220 from the reverse battery condition.

However, if a flyback diode is introduced across the DC motor 210, in a reverse battery condition the current flow would be able to effectively bypass the DC motor 210, with only the two diodes in series (i.e. the flyback diode and the intrinsic diode of the NMOS device 220) providing resistance to the current flow. Specifically, the two diodes in series would clamp the reverse battery voltage at 1.6V (0.8+0.8); such a low clamping voltage resulting in a sufficiently high current to destroy the NMOS device 220. Thus, in an automotive application, and as illustrated in FIG. 2, no flyback diode is provided across the DC motor 210 in order to enable a reverse battery condition to be sustained without destroying the NMOS device 220.

Instead of a flyback diode, the voltage at the source node 224 of the NMOS diode 220 may be clamped at, for example, −5V by a clamp circuit (not shown) which forces current to flow through the NMOS device 220 if the voltage at the source node 224 is low than −5V. Advantageously, by configuring the threshold voltage level ($V_{REF}$) to comprises a magnitude equal to the required negative clamp voltage (−5V), whenever the voltage at the source node 224 of the NMOS device 220 falls to this required negative clamp voltage, the detection component 290 will detect as such, and cause the current source 280 to supply current to the bootstrap capacitance 240, which in turn will allow current to be drawn there from, and into the DC motor 210.

Thus, a charging circuit 270 for an inertial load driver circuit 200 has been illustrated and described that enables a bootstrap capacitance for the driver circuit 200 to be (re) charged during an off state of the driver circuit, without consuming power from a voltage supply or the like during the off state of the driver circuit. In particular in the illustrated example, the charging circuit 270 is arranged to utilise energy stored within the inertial load to (re)charge the bootstrap capacitance 240.

Figure 3:
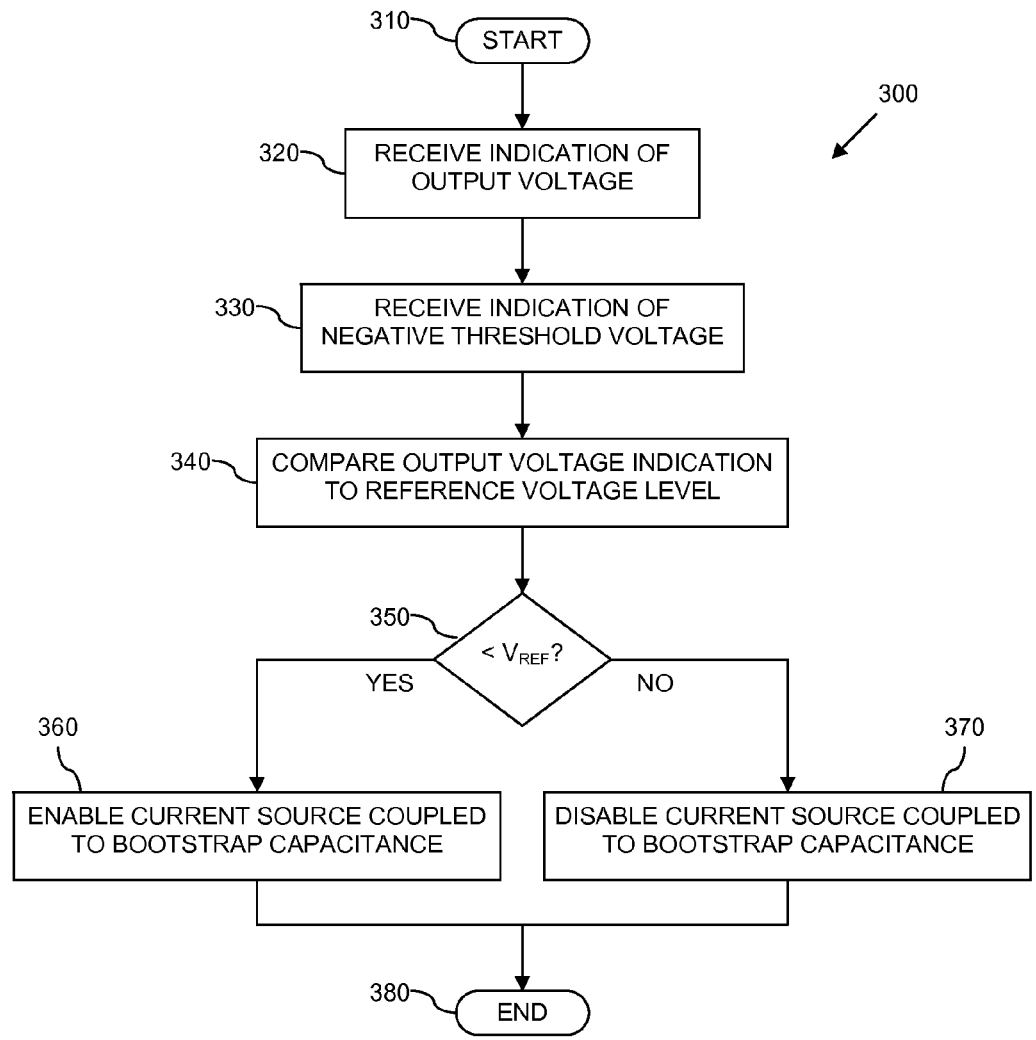
FIG. 3 illustrates a simplified flowchart of an example of a method of charging at least one bootstrap charge storage element within an inertial load driver circuit.

Referring now to FIG. 3, there is illustrated a simplified flowchart 300 of an example of a method of charging at least one bootstrap charge storage element within an inertial load driver circuit. The method starts at 310, and moves on to 320 where an indication of an output voltage of a switching element of the driver circuit is received, for example such as the voltage at the source node 224 of the NMOS device 220 in the example illustrated in FIG. 2. Next, at 330, an indication of a negative threshold voltage is received. The indication of an output voltage of the switching element and the indication of the negative threshold voltage are then compared, at 340. If, at 350, the indicated output voltage is less than the indicated negative threshold voltage, the method moves on to 360 where a current source coupled to the bootstrap charge storage device is enabled such that current is drawn into the bootstrap charge storage device by the negative voltage at the output of the switching element of the driver circuit. Conversely if, at 350, the indicated output voltage is not less than the indicated negative threshold voltage, the method moves on to 370 where the current source is disabled. The method then ends, at 380.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A charging circuit for at least one bootstrap charge storage element within an inertial load driver circuit, the at least one bootstrap charge storage element comprising a first node operably coupled to an output node of at least one switching element of the inertial load driver circuit; the charging circuit comprising:
   at least one current source controllable to provide a current to a second node of the at least one bootstrap charge storage element; and
   at least one detection component arranged to:
      receive at a first input thereof an indication of a voltage level at the output node of the at least one switching element of the inertial load driver circuit;
      detect if the voltage level at the output node of the switching element of the inertial load driver circuit is below a negative threshold voltage level; and
      control the at least one current source to provide a current to the second node of the at least one bootstrap charge storage element if the voltage level at the output node of the switching element of the inertial load driver circuit is below the negative threshold voltage level.

2. The charging circuit of claim 1, wherein the negative threshold voltage level comprises a negative voltage level magnitude equal to a negative clamp voltage of the inertial load driver circuit.

3. The charging circuit of claim 1, wherein the at least one detection component is arranged to:
   receive at a second input thereof an indication of the negative threshold voltage level;
   compare the received indication of a voltage level at the output node of the switching element of the inertial load driver circuit to the received indication of the negative threshold voltage level; and
   output an indication of a result of the comparison to the at least one current source.

4. The charging circuit of claim 3, wherein the at least one detection component comprises a comparator component.

5. The charging circuit of claim 1, wherein the at least one current source comprises at least one switching element operably coupled between the second node of the at least one bootstrap charge storage element and a ground plane for the inductive load driver circuit, and arranged to selectively couple the second node of the at least one bootstrap charge storage element to the ground plane.

6. The charging circuit of claim 5, wherein at least one switching element of the at least one current source comprises at least one n-channel metal oxide semiconductor field effect transistor.

7. The charging circuit of claim 1, wherein at least one switching element of the inertial load driver circuit comprises at least one n-channel metal oxide semiconductor field effect transistor.

8. The charging circuit of claim 1, wherein the inertial load driver circuit is arranged to drive a direct current, DC, motor.

9. The charging circuit of claim 1, wherein the inertial load driver circuit is arranged to be operably coupled between an inertial load and a positive supply voltage.

10. The charging circuit of claim 1, wherein the inertial load driver circuit comprises at least one switching element control component comprising circuitry arranged to output a control signal to the at least one switching element of the inertial load driver circuit; wherein a negative supply voltage input for the switching element control component circuitry is operably coupled to the output of the at least one switching element of the inertial load driver circuit, and a positive supply voltage input of the switching element control component circuitry is operably coupled to the negative supply via the at least one bootstrap charge storage element.

11. The charging circuit of claim 1 implemented within an integrated circuit device comprising at least one die within a single integrated circuit package.

12. An inertial load driver circuit comprising the charging circuit of claim 1.

13. A method of charging at least one bootstrap charge storage element within an inertial load driver circuit, the at least one bootstrap charge storage element comprising a first node operably coupled to an output of at least one switching element of the inertial load driver circuit; the method comprising:
   receiving an indication of a voltage level at the output node of the at least one switching element of the inertial load driver circuit;
   detecting if the voltage level at the output node of the switching element of the inertial load driver circuit is below a negative threshold voltage level; and
   controlling at least one current source to provide a current to a second node of the at least one bootstrap charge storage element if the voltage level at the output node of the switching element of the inertial load driver circuit is below the negative threshold voltage level.

* * * * *